United States Patent [19]

Hara

[11] Patent Number: 4,939,499
[45] Date of Patent: Jul. 3, 1990

[54] MAGNETIC POLE DETECTING HALL ELEMENT

[75] Inventor: Masayoshi Hara, Komagane, Japan

[73] Assignee: Kabushiki Kaisha Sankyo Seiki Seisakusho, Japan

[21] Appl. No.: 373,884

[22] Filed: Jun. 30, 1989

[30] Foreign Application Priority Data

Jul. 11, 1988 [JP] Japan .............................. 63-91813[U]

[51] Int. Cl.5 ...................... H01L 43/00; H03K 17/90; H01F 7/00
[52] U.S. Cl. .................................. 338/32 H; 307/309
[58] Field of Search ............................ 338/32 H, 32 R; 307/309; 329/200

[56] References Cited

U.S. PATENT DOCUMENTS

| 3,139,600 | 6/1964 | Rasmanis et al. | 338/32 H |
| 4,156,820 | 5/1979 | Fukuda et al. | 338/32 R X |
| 4,354,071 | 10/1982 | Pietschmann | 338/32 H X |
| 4,401,966 | 8/1983 | Ohmura et al. | 338/32 H X |
| 4,827,240 | 5/1989 | Häfner | 338/32 H X |

FOREIGN PATENT DOCUMENTS 34492 7/1984 Japan .
20313 10/1987 Japan .

Primary Examiner—Bruce A. Reynolds
Assistant Examiner—Marvin M. Lateef
Attorney, Agent, or Firm—Jones, Tullar & Cooper

[57] ABSTRACT

A magnetic pole detecting Hall element includes a Hall element chip which is buried in a package made of resin. Leg portions having a mounting plane perpendicular to the magnetic field sensitive surface of the Hall element are formed on the package.

8 Claims, 3 Drawing Sheets

MAGNETIC POLE DETECTING HALL ELEMENT

FIELD OF THE INVENTION

The present invention relates to a magnetic pole detecting Hall element which can be applied e.g. for detecting the rotational position of the rotor in various sorts of driving motors, etc.

BACKGROUND OF THE INVENTION

For example, among various sorts of brushless driving motors, there are those in which, in order to make current flow in good timing through driving coils of different phases, depending on the rotational position of the rotor magnet, Hall elements for detecting magnetic poles of the rotor magnet are used. The conduction timing of the driving coils of different phases can then be determined on the basis of the detection signal obtained by these Hall elements.

FIG. 8 illustrates a prior art example of such a magnetic pole detecting Hall element, in which a Hall element chip 65 is secured to a bridge-shaped holder 67. The two extremity portions of holder 67 are bent so as to form leg portions 68 so that the magnetic field sensitive surface 66 of chip 65 is parallel to the front surface of the holder 67. The holder 67 is secured to e.g. a predetermined circuit pattern, etc. on a wiring board 69 with the leg portions 68 of the two extremity portions of the holder 67 being secured so that the magnetic field sensitive surface 66 stated above is also parallel to the board 69. The magnetic field sensitive direction of the Hall element is the direction which is perpendicular to the magnetic field sensitive surface 66 as indicated by an arrow in FIG. 8. Consequently, it can detect only the magnetic pole generating a magnetic flux perpendicular to the wiring board 69.

The prior art magnetic pole detecting Hall element is suitable for detecting the magnetic pole by locating it face to face with a flat magnet such as those in a face-to-face type brushless motor, because the magnetic field sensitive direction is perpendicular to the surface on which the Hall element 65 is mounted, i.e. the surface of the wiring board 69. On the contrary, in a magnet in which magnetic poles are arranged along the periphery of a cylinder, even if it is tried to detect the magnetic poles by locating Hall elements face to face with the peripheral surface of the magnets, it is not possible to detect the magnetic flux, because the magnetic flux passes parallely to the magnetic field sensitive surface 66 of the Hall elements. Further, since the holder 67 has no reference for use in positioning it with respect to the wiring board 69, the precision of the mounting position is not good and it is not possible to detect the magnetic pole with a high precision. As the result, there is a problem that the efficiency of the motor is lowered.

In order to solve this problem, a technique has been adopted, by which the Hall element is mounted so as to be perpendicular to the magnetic field sensitive surface, as disclosed in JP-Utility Model-A-59-34492. However, since the Hall element 14 is positioned by means of a positioning plate in the Utility Model A-59-34492, the mounting and the regulation of the Hall element are very troublesome and the number of parts increases. Another sensor holder is disclosed in JP-Utility Model A-62-20313, on which an MR sensor, a kind of magnetic field sensitive element, is mounted. However, in this sensor holder also the holder and the sensor are constructed separately from each other. In addition, the mounting of the sensor is effected by passing a screw pass through an elongated hole formed in the holder so that the positional regulation can be effected together with the fixing operation.

OBJECT OF THE INVENTION

The object of the present invention is to provide a magnetic pole detecting Hall element which can be mounted with a high precision without regulating the mounting position and which is hardly influenced by heat produced in the soldering step.

SUMMARY OF THE INVENTION

In order to achieve the above object, a magnetic pole detecting Hall element is provided in which a Hall element chip is formed by molding in one body, in the form of a package made of resin. According to this invention, the element is characterized in that it is provided with a magnetic pole detecting surface (magnetic field sensitive surface) disposed so as to be opposite to one of magnetic poles to be detected for detecting variations of the magnetic poles. Leg portions are formed in one body with the package stated above for mounting the magnetic pole detecting Hall element on a surface. Leg mounting surfaces perpendicular to the magnetic pole detecting surface are provided on the bottom surfaces of the leg portions. When the mounting surfaces are brought into contact with the leg surface on which the element is to be mounted so that the magnetic pole detecting Hall element is mounted thereon, then the bottom surface of the chip package is spaced from the surface on which it is to be mounted, the magnetic pole detecting surface is located opposite to one of the magnetic poles, which are the objects to be detected.

DETAILED DESCRIPTION

Hereinbelow some preferred embodiments of the magnetic pole detecting Hall element according to this invention will be explained referring to FIGS. 1 to 7.

Figure 1:
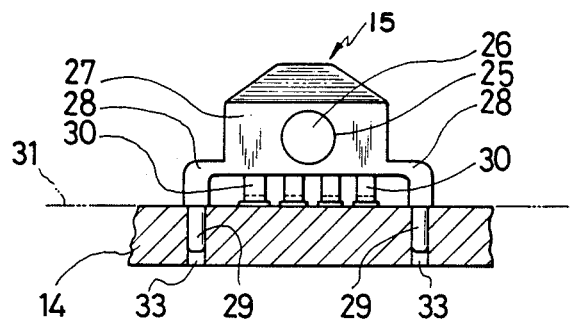
FIG. 1 is a front view of an embodiment of the magnetic pole detecting Hall element according to the present invention.
Figure 2:
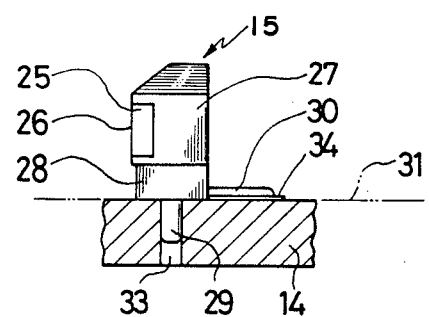
FIG. 2 is a side view of the same.
Figure 3:
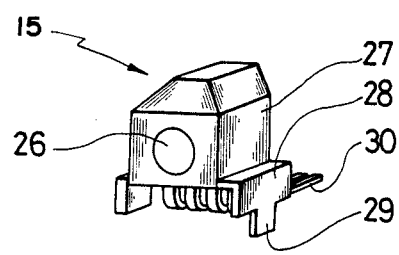
FIG. 3 is a perspective view of the same.

In FIGS. 1 to 3, a Hall element chip 25 having a magnetic field sensitive surface 26 is buried in a package 27 made of resin. The Hall element chip 25 is buried in the package 27 so that the magnetic field sensitive surface 26 thereof is positioned in a plane, which is same as the front surface of the package 27. The package 27 has leg portions 28 on both the sides, left and right, viewed from the front. A narrow positioning pin 29 is integral with and protrudes from the lower extremity of each of the leg portions 28. The plane including the line along the interface between the leg portions 28 and the positioning pins 29 forms a mounting plane 31 perpendicular to the magnetic field sensitive surface 26. A plurality of terminals 30 connected with electrodes of the Hall element chip 25 protrude from the rear lower extremity portion of the package 27. The lower end surface of each of these terminals 30 is approximately on the same plane as the mounting plane 31.

The positioning point 29 at the extremity of each of the leg portions 28 is inserted in a mounting hole 33 formed in a board 14. In this way, the mounting plane 31 stated above is in accordance with the upper surface of the board 14 and thus the Hall element chip 25 can be mounted with a high precision at a predetermined position together with the package 27. Further, since the magnetic field sensitive surface 26 of the Hall element chip 25 stands perpendicularly with respect to the plane of the board 14 and magnetic flux coming in the direction parallel to the plane of the board 14 traverses the magnetic field sensitive surface 26 at a right angle, the Hall element chip 25 can detect the magnetic flux described above. In the case where the mounting plane 31 stated above is in accordance with the upper surface of the board 14, since the extremity of each of the terminals 30 is approximately on the upper surface of the board 14, the terminals can be soldered with a wiring pattern, etc. formed on the board 14.

Figure 4:
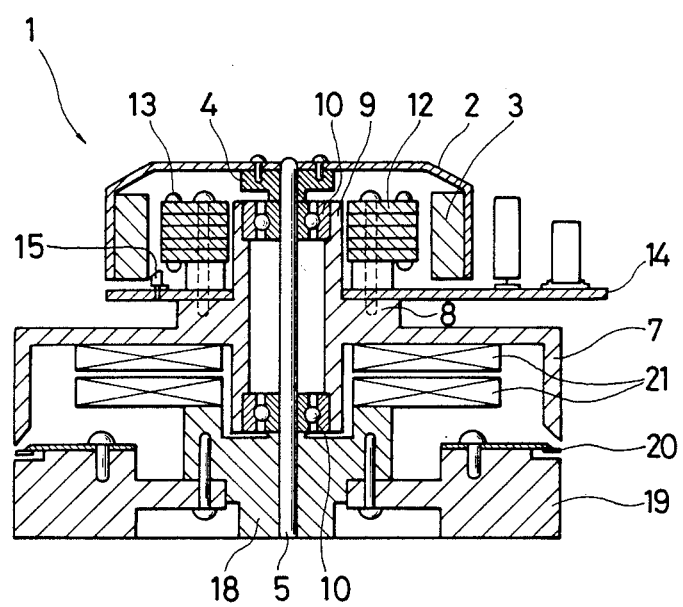
FIG. 4 is a longitudinal cross-sectional view of an example of a rotating magnetic head device using a Hall element according to the embodiment stated above.

FIG. 4 shows an example, in which the magnetic pole detecting Hall element according to the embodiment described above is applied to a driving motor for a rotating cylinder head in a video tape recorder, etc. In FIG. 4, one end portion of a rotating shaft 5 is mounted through a boss 4 at the center of a flat-cup-shaped rotor yoke 2 of the rotating driving motor 1 for the rotating cylinder head. The rotating shaft 5 is supported rotatably by an upper and a lower bearing 10,10, forming a pair, within a cylindrical holder portion 9 formed, protruding on one extremity side of a fixed drum 7 of the rotating cylinder head. The printed wiring board 14 is mounted on a motor mounting part 8 formed stepwise between the main part of the fixed drum 7 and the holder portion 9 in the case where the holder portion 9 is inserted in the center hole thereof. Further, the stator core 12 of the motor 1 is superposed on the wiring board 14 so as to surround the holder portion 9 described above. The stator core 12 and the wiring board 14 are secured to the fixed drum 7 in one embodiment by a mounting screw passing therethrough in the motor mounting portion 8. A driving coil 13 having a predetermined number of phases is wound around the stator core 12.

A cylindrical rotor magnet 3 is fixed on the inner peripheral surface of the rotor yoke 2 so that the inner peripheral surface is opposite to the outer peripheral surface of the stator core 12 with a predetermined interval, or gap. An appropriate number of magnetic poles are formed so as to be adjacent to each other with a predetermined spacing along the periphery of the rotor magnet 3 by magnetizing it in the direction of the thickness thereof.

The lower end portion of the rotating shaft 5 protrudes downward from the lower end surface of the fixed drum 7 and a rotating drum 19 is mounted, in one embodiment, on this protrusion of the rotating shaft 5 through a disk 18. A rotating magnetic head such as is well-known for a video tape recorder or in a digital audio tape recorder, is constituted by the rotating drum 19 and the fixed drum 7. That is, a magnetic head 20 is mounted on the rotating drum 19 so that the surface thereof, with which a tape is slidingly contacted, is exposed in the gap between the rotating drum 19 and the fixed drum 7. Further a rotary transformer 21 for transmitting and receiving signals to/from the magnetic head 20 is mounted on both the drums 19 and 7.

A Hall element 15 is mounted on the wiring board 14. This Hall element 15 has the same structure as the Hall element explained above referring to FIGS. 1 to 3. A magnetic field sensitive surface 26 of a Hall element chip 25 buried in a package 27 is opposite to the inner peripheral surface of the cylindrical rotor magnet 3. Magnetic flux emerging from the magnetic pole which is opposite to the Hall element chip 25, among the magnetic poles of the rotor magnet 3, passes through the magnetic field sensitive surface 26 of the Hall element chip 25 in the direction perpendicular thereto. Accordingly, it is possible to detect the magnetic poles of the rotor magnet 3 by means of the Hall element chip 25. The rotor of the motor 1 and the rotating drum 19 mounted thereon in one body can be driven so as to rotate continuously by controlling the current flowing through each of the phases of the driving coil 13 on the basis of the detection signal thus obtained. The number of Hall elements 15 is generally 2 for a 2-phase motor and 3 for a 3-phase motor. Apart from the Hall element 15, circuit parts such as resistances, ICs, etc. are mounted on the wiring board 14.

Although in the example indicated in FIG. 4, the motor is of outer rotor type, it is possible to detect the magnetic poles of the rotor magnet by means of the magnetic pole detecting Hall element according to this invention also in the case where the motor is of inner rotor type.

According to the embodiment described above, since leg portions 28, having a mounting surface 31 perpendicular to the magnetic field sensitive surface 26 of the Hall element chip 25, are formed in one body with a package 27, in which the Hall element chip 25 is buried, the Hall element chip 25 can be mounted so that the magnetic field sensitive surface 26 thereof is perpendicular to the mounting surface of the board 14. In a cylindrical rotor magnet, in which magnetic poles are arranged along the periphery thereof, the Hall elements described above can be arranged in the neighborhood of the peripheral surface of the magnet so as to be opposite thereto. Thus it is possible to obtain a large detection output. Further, since the leg portions 28 having a mounting plane 31 are formed on the package 27, it is possible to mount the Hall element 15 with a high positional precision by making this mounting plane 31 be in accordance with the surface of the board 14. In particular, since the positioning pin 29 is formed integrally at the extremity of the leg portion 28 in the embodiment described above, the Hall element 15 can be mounted with a higher positional precision and more surely by inserting this pin 29 in a mounting hole 33 formed in the board 14. Furthermore, since collapse and consequent misalignment of the Hall element 15 is prevented by the leg portion 28 of the package 27 and the magnetic field sensitive surface 26 is always kept perpendicular to the mounting surface of the board, etc., it is possible to obtain detection output which is always stable, with a high precision.

Figure 5:
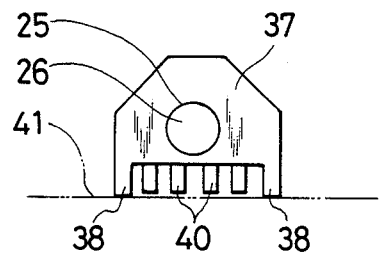
FIG. 5 is a front view of another embodiment of the magnetic pole detecting Hall element according to the present invention.
Figure 6:
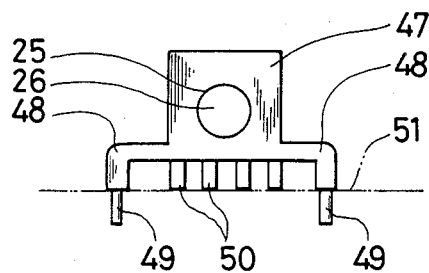
FIG. 6 is a front view of still another embodiment of the magnetic pole detecting Hall element according to the present invention.
Figure 7:
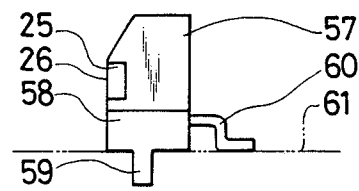
FIG. 7 is a side view of still another embodiment of the magnetic pole detecting Hall element according to the present invention.
Figure 8:
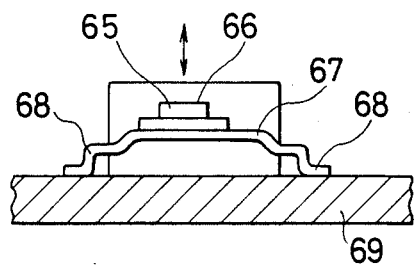
FIG. 8 is a front view of an example of prior art magnetic pole detecting Hall elements.

FIGS. 5 to 7 show variations of the magnetic pole detecting Hall element according to the present invention.

In the embodiment indicated in FIG. 5, the positioning pin used in the preceding embodiment is omitted. Reference numeral 37 indicates a package made of resin, with no positioning pins disposed on the leg portions 38 formed on both the sides thereof. The plane including the lower end surfaces of the leg portions 38 constitutes a mounting surface 41. This mounting surface 41 is perpendicular to the magnetic field sensitive surface 26 of the Hall element chip 25 buried in package 37. Reference numeral 40 represents a terminal.

In the embodiment illustrated in FIG. 6, when a package 47 is mounted, the stability is improved by leg portions 48, formed integrally on both sides, left and right, of package 47 so as to protrude on both the left and sides. A positioning pin 49 protrudes from the lower end of each of the leg portions 48. The interface between the leg portion 48 and the pin 49 constitutes a mounting surface 51 perpendicular to the magnetic field sensitive surface 26 of the Hall element chip 25. Terminals 50 protrude from the package 47.

A feature of the embodiment indicated in FIG. 7 is that each of terminals 60 protruding from a package 57 is bent in a crank shape so that only the extremity portion thereof is positioned approximately in a mounting plane 61 and the other constructions are identical to those in the embodiment indicated in FIGS. 1 to 3. Reference numerals 58 and 59 represent a leg portion and a positioning pin, respectively.

As explained above, according to this invention, the leg portions of a Hall element package have a mounting surface which is perpendicular to the magnetic field sensitive surface of the Hall element chip. The leg portions are formed integrally with the package, in which the Hall element chip is buried, so it is possible to mount the Hall element chip so that the magnetic field sensitive surface thereof is perpendicular to the mounting surface of the board. Also, in a cylindrical rotor magnet in which magnetic poles are arranged along the periphery thereof, it is possible to locate Hall elements in the neighborhood of the peripheral surface of the magnet so as to be opposite thereto and to obtain a large detection output. Further, since the leg portions are formed on the package to provide a mounting plane, the Hall elements can be mounted with a high precision by making the mounting plane coincide with the surface of the board. Furthermore, since the leg portions of the package support the Hall element in position, the magnetic field sensitive surface is always kept perpendicular to the mounting plane of the board, etc. Accordingly, it is always possible to obtain a stable detection output with a high precision.

In addition, it is posible to mount the Hall element chip in a position where the bottom surface of the package is separated from the board, the Hall element is not influenced by heat produced in the soldering step.

What is claimed is:

1. A magnetic pole detecting Hall element comprising:
   a Hall element chip molded in a unitary resin package, and having a magnetic pole-detecting face portion;
   leg portions integral with said package for mounting said Hall element on a surface;
   a mounting plane defined by said leg portions, said mounting plane being spaced from said package and being perpendicular to said face portion, said mounting plane coinciding with said surface when said package is mounted thereon, whereby said package is spaced a predetermined distance from said surface to accurately locate said face portion with respect to magnetic poles to be detected, whereby said Hall element is capable of detecting variations in the magnetic poles.

2. The magnetic pole-detecting Hall element of claim 1, further including input terminals and output terminals disposed on said package and having first ends connected to said element chip and second ends extending out of said package, said second ends having portions lying on said mounting plane.

3. The magnetic pole-detecting Hall element of claim 2, further including mounting pins on said leg portions for engaging corresponding holes formed on said surface so as to accurately position said element with respect to said surface.

4. The magnetic pole-detecting Hall element of claim 1, further including mounting pin means on said leg portions for engaging corresponding holes formed on said surface so as to accurately position said element with respect to said surface.

5. The magnetic pole-detecting Hall element of claim 1, wherein said leg portions extend downwardly from said Hall element chip package, and wherein said mounting plane is defined by the lowermost ends of said leg portions.

6. The magnetic pole-detecting Hall element of claim 5, wherein said mounting pin means includes a downwardly extending pin mounted on the lowermost end of each of said leg portions.

7. The magnetic pole-detecting Hall element of claim 6, wherein said input and output terminals extend downwardly from said Hall element chip package to said mounting plane.

8. The magnetic pole-detecting Hall element of claim 6, wherein said input and output terminals extend rearwardly from said Hall element chip package in a direction perpendicular to said face portion, and then downwardly to said mounting plane.

* * * * *